US009170875B2

(12) United States Patent
Mueller et al.

(10) Patent No.: US 9,170,875 B2
(45) Date of Patent: Oct. 27, 2015

(54) METHOD FOR MONITORING A DATA MEMORY

(75) Inventors: Bernd Mueller, Leonberg (DE);
Carsten Gebauer, Boeblingen (DE);
Dieter Thoss, Schwieberdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 369 days.

(21) Appl. No.: 13/809,764

(22) PCT Filed: Jun. 27, 2011

(86) PCT No.: PCT/EP2011/060700
§ 371 (c)(1),
(2), (4) Date: Mar. 29, 2013

(87) PCT Pub. No.: WO2012/007266
PCT Pub. Date: Jan. 19, 2012

(65) Prior Publication Data
US 2013/0191701 A1 Jul. 25, 2013

(30) Foreign Application Priority Data
Jul. 13, 2010 (DE) .......................... 10 2010 031 282

(51) Int. Cl.
*G11C 29/00* (2006.01)
*G06F 11/10* (2006.01)
*G11C 29/04* (2006.01)

(52) U.S. Cl.
CPC ............ *G06F 11/10* (2013.01); *G06F 11/1048* (2013.01); *G11C 2029/0411* (2013.01)

(58) Field of Classification Search
CPC .............. G06F 11/073; G06F 11/0787; G06F 11/1008; G06F 11/10; G06F 11/1048; G06F 11/1076; G06F 2211/1088
USPC .................................... 714/37, 765, 108, 764
See application file for complete search history.

(56) References Cited

U.S. PATENT DOCUMENTS

| 5,511,164 A * | 4/1996 | Brunmeier et al. ............. 714/53 |
| 2002/0016942 A1 | 2/2002 | MacLaren et al. |
| 2002/0104045 A1* | 8/2002 | Cooper .......................... 714/42 |
| 2006/0282755 A1 | 12/2006 | Oh |
| 2008/0133994 A1* | 6/2008 | Oh ............................... 714/746 |
| 2008/0301530 A1 | 12/2008 | Spanel et al. |
| 2009/0070630 A1 | 3/2009 | Khatri et al. |
| 2011/0022928 A1* | 1/2011 | Honda .......................... 714/763 |

FOREIGN PATENT DOCUMENTS

| CN | 1250213 | 4/2000 |
| GB | 2 428 499 | 1/2007 |

OTHER PUBLICATIONS

International Search Report, International Application No. PCT/EP2011/060700, dated Sep. 22, 2011.

\* cited by examiner

*Primary Examiner* — David Ton
(74) *Attorney, Agent, or Firm* — Kenyon & Kenyon LLP

(57) ABSTRACT

A method is described for monitoring a data memory in which an error detection method is used to detect and/or correct incorrect data words stored in memory lines of the data memory, an address of the data memory at which a data word evaluated as incorrect by the error detection method is stored being written to an auxiliary memory and being made available to a checking program.

27 Claims, 2 Drawing Sheets

METHOD FOR MONITORING A DATA MEMORY

FIELD

The present invention relates to a method for monitoring a data memory in which an error detection method is used to detect and/or correct incorrect data words that are stored in the data memory.

In addition, the present invention relates to a checking program for carrying out the method, a storage medium containing the checking program, and an auxiliary memory.

BACKGROUND INFORMATION

Modern microcontrollers require data memories having a capacity of several hundred kilobytes, for example for static data memory (RAM, or Random Access Memory), or several megabytes, for example for the permanent storage of programs in so-called flash memories. Corresponding to the large memory volumes, or the technical realization thereof, data errors are comparatively frequent or at least probable. There are two fundamental types of error occurrences: the first are permanent errors, in the case of which repeated write and read cycles do not yield improvement. Secondly, in RAM memories individual data errors that disappear after a write-read cycle may occur, caused for example by alpha radiation.

Therefore, in order to improve data security error-securing methods (ECC, or Error Correction Code) are often used. For example, one-bit errors can always be corrected, two-bit errors can always be detected, and multi-bit errors can usually, but not always, be detected. However, the ECC method evaluates many data words having multiple errors as, in some cases, a data word differing from the original content and having a bit error, and correspondingly corrects these words wrongly.

Application of a sample ECC method to randomly produced data words has shown that this ECC method for example evaluates 28% of a sequence of data words as valid data words having an individual error, and evaluates the remaining 72% of the data words as invalid, relative to a respective formation rule of the ECC method. In security-critical applications, however, the requirements of international standards are very high. For example, the norm ISO 26262, ASIL-D requires that more than 99% of such randomly produced data words must be recognized as invalid.

Therefore, conventional expanded measures provide the increasing of a number of check bits added by the data words (so-called redundant bits) in order to improve the correction or detection of data errors even in the case of multi-bit errors. This requires an additional outlay of memory elements of the data memory, and correspondingly makes this memory more expensive.

In addition, the ECC method can be carried out in two steps, by applying, in succession, a so-called inner coding (ECC) and an outer coding (EDC, CRC) to the data words. However, this method is also connected with a high outlay and is expensive.

SUMMARY

In accordance with the present invention, one or more addresses of a data memory, at each of which addresses a data word evaluated by an error detection method as incorrect is stored, is written to an auxiliary memory and is made available to a checking program. Below, a method that corrects errors (so-called error correction method) is also understood to be an error detection method.

The method according to the present invention has the advantage that the data words of a data memory can be protected particularly well against errors and/or defects without having to enlarge the data memory or having to apply multistage error detection methods.

In accordance with the present invention, it is recognized that today's data memories are capable of storing a very large number of data words, while at the same time the susceptibility to transient errors or permanent defects due to physical causes is increasing. In particular, the example embodiments of the present invention take into account that transient errors or permanent defects in data memories often affect only individual memory lines or a few memory lines, or the data words stored therein. Thus, standard preventative measures for improving data security may not be suitable insofar as they require an outlay proportional to the size of the data memory.

In accordance with the present invention, therefore, those addresses of the data memory at which there is stored a data word evaluated as incorrect by an error detection method, e.g., an ECC method, are written to an auxiliary memory and are thus handled separately. In this way, the overall expense can be kept comparatively small. The information stored in the auxiliary memory is advantageously provided to a checking program and is for example examined regularly by the checking program. From this, measures are derived for increasing the data security of the data memory, as is described further below on the basis of a possible exemplary embodiment.

For terminological clarity, the following is to be noted: the data memory is controlled via "addresses," each of which refers to a so-called memory line of the data memory. Each memory line of the data memory includes a plurality of (physical) so-called memory locations in each of which there is stored a one-bit item of information, i.e., an individual data bit. The totality of the data bits stored in a memory line is referred to as a data word. In the memory lines or memory locations, "errors" may occur that are either "transient errors" or "permanent defects." The auxiliary memory stores the addresses in a number N of "address registers," such that at each address register a further item of information is stored that includes for example an "occupancy bit." "Data" are understood as arbitrary items of information that can be stored in data memories.

According to an advantageous specific embodiment, it is provided that the error detection method is generally carried out using an electronic circuit allocated to the data memory. Such an error detection method is for example executed as a so-called "Error Correction Coding" (ECC). This can advantageously be carried out using the electronic circuit by which the data to be written to the data memory are supplemented with so-called redundant bits that are acquired during a later read process and are evaluated, whereby particular errors or error patterns can be detected and/or corrected. In this way, computing time can be saved and costs can be reduced.

An example embodiment of the method provides that only those addresses are written to the auxiliary memory whose data words have been evaluated by the error detection method as having a one-bit error. One-bit errors are characteristic, in a particular way, both for the occurrence of transient errors, i.e., those errors that temporarily affect only a single write and read process, and also for permanent defects of memory locations of the data memory. In addition, for one-bit errors it is possible to use downstream system measures to ensure security and reliability at the system level.

The management of the auxiliary memory is simplified if, for each address stored in the auxiliary memory, it is indicated whether this address is valid. For example, an "occupancy bit" stored for each address can easily make it possible to distinguish between an occupied address register, which thus contains a "valid" address, and a non-occupied, i.e., empty, address register. In this way, the auxiliary memory can be used particularly efficiently. During initialization, it is therefore advantageous if these occupancy bits are set to invalid.

In addition, it is provided that when an incorrect data word is detected by the error detection method, first the valid addresses of the auxiliary memory are examined in order to find out whether the address of the incorrect data word is already stored. If this is the case, the content of the auxiliary memory is not modified. If, in contrast, the address of the incorrect data word is not stored in the auxiliary memory, the storage takes place in an empty address register, and the associated occupancy bit is set.

The example method provides in particular that the data word whose address is stored in the auxiliary memory is examined by the checking program in order to find out whether the data word has a one-bit error or a multi-bit error, and/or whether the memory line of the data word has a defect that corresponds to a one-bit error or to a multi-bit error, and/or whether an error of the memory line of the data word occurs temporarily or permanently, and/or which memory locations within the memory line are affected in each case. Thus, the data word, or the memory line, and the memory locations contained therein can be examined, evaluated, and if necessary corrected in a particularly thorough manner. The details of this are described more specifically in the following on the basis of an exemplary embodiment of the present invention.

In particular, it can be provided that, given a detected transient error, the associated address in the address register of the auxiliary memory is erased, or the associated occupancy bit is reset. Moreover, it is possible to do completely without the use of occupancy bits as long as non-occupied address registers are filled completely with binary zeros.

As a function of the design of the data memory, the method can be used differently if the checking program carries out, for a volatile memory, a write-read test adapted to error mechanisms that are to be expected, and for a non-volatile memory carries out an error test using a checksum of a CRC coding. For example, the distinction between one-bit errors and multi-bit errors in volatile memories can advantageously take place using a write-read test adapted to error patterns that are to be expected in each case. In the case of non-volatile memories, this can be done via a CRC checksum method, or cyclic redundancy check, over a larger data block.

In a preferred embodiment of the example method, it is provided that a distinction is made between, first, errors that can be properly corrected, second, multi-bit errors that have been wrongly corrected or wrongly detected, and/or third, transient errors or permanent defects. In particular, according to the present invention this preferably takes place using computer-supported procedures, i.e., those based on software. "Properly correctable errors" are understood in each case as one-bit errors based on standard ECC quantities. However, as a function of the technical means used, multi-bit errors may also fall into this category. In order to make these distinctions, therefore, no additional outlay of electronic circuitry is required, so that the method can operate flexibly and can be individually adapted.

In addition, it is provided that boundary values are specified for a permissible number of one-bit errors and/or multi-bit errors and/or one-bit defects and/or multi-bit defects, and that when at least one boundary value is exceeded there takes place a reaction of the memory management. In this way, the example method can easily be adapted to particular requirements, for example with regard to data security on the one hand and the availability of the data memory on the other hand. For example, already in the case of a one-bit defect and/or individual multi-bit errors or multi-bit defects—where multi-bit errors or multi-bit defects may in some cases not be corrected—there can take place a reaction of the memory management which is explained in more detail below.

The example method is particularly useful when the reaction of the memory management includes at least one of the following measures:

deactivation of a defective memory line and/or allocation of a substitute memory line;

deactivation of a defective memory line region and/or allocation of a substitute memory line region;

production of a message, an alarm, and/or an error bit;

transfer of the data memory and/or of a system at a higher level than the data memory into a state evaluated as safe.

In this way, single or multiple memory lines detected as defective can be deactivated and substitute memory lines, or even substitute memory line regions, can be allocated. For this purpose, suitable conventional methods are available. In addition, a message or an alarm can also be produced, which is important for example in safety-sensitive systems, such as motor vehicles. As needed, the data memory or higher-order system, or a subsystem, can also be transferred to an appropriate state evaluated as safe.

Independent of the functioning of the checking program, alternatively or in addition an overflow signal of the auxiliary memory can be used to transfer the data memory and/or the higher-order system into a state evaluated as safe.

According to an example embodiment of the present invention, it is further provided that before switching off the data memory, or switching off a system at a higher level than the data memory, the content of the auxiliary memory is saved to a non-volatile memory and can be reconstructed therefrom after a switching on. Thus, the error history of a previous operating session is retained, and can be advantageously reused after the following switching on, for example in order to rapidly detect particularly frequently located errors or defects, and to remove or avoid them.

A supplementation of the example method is that transient errors and/or permanent defects are counted and/or statistically evaluated. In this way, the checking program can carry out expanded operations supplementing the assessment of the usability of the data memory, for which a conventional circuit for error detection is not suitable.

In addition thereto, it is provided that a result of the counting and/or of the statistical evaluation is communicated to a manufacturer of the data memory or of the higher-order system. This communication can take place using remotely acting diagnostic systems, which are mostly still technically in the preparatory stages, and can for example provide the manufacturer of the motor vehicle and/or the manufacturer of the data memory with early information concerning problems that may be beginning.

The example method may operate more effectively if, after switching on and/or during operation of the data memory, a functional test is carried out, and if in this way addresses of the data memory that point to memory lines evaluated as incorrect during the functional test according to the method are written to the auxiliary memory. The functional test is, in the case of volatile memories, preferably realized as a write-read test, and in non-volatile memories as a read-only test. In this way, procedures that may be present can advantageously be supplemented by the method, and according to the present invention additional items of information are produced that can be used for an assessment of the data security in the data memory.

In addition, in connection with the write-read test it is provided that via those memory lines whose addresses are stored in the auxiliary memory a first checksum is formed, the first checksum is stored, and in further operation of the data memory at least one further checksum is regularly formed over those memory lines whose addresses were stored in the auxiliary memory, and the at least one additional checksum is compared with the first checksum.

According to a preferred specific embodiment, the addresses used for the formation of the first checksum are additionally saved. These additionally saved addresses can subsequently be used for the formation of the at least one further checksum. In this way, it is achieved that the further checksums can be formed independently of a current content of the auxiliary memory.

In this way, it is advantageously possible to subject individual memory lines or memory line regions, known as non-modifiable or changeable, to a regular test: after the beginning of operation and after a certain operating time of the data memory, and by carrying out the example method according to the present invention and, if warranted, a write-read test, in the auxiliary memory the addresses are present of those memory lines that were evaluated as having a one-bit error or one-bit defect. Such one-bit errors or one-bit defects are assumed to be correctable by the error detection system. As a function of the specific embodiment of the error detection, the procedure can if warranted continue in the same way with correctable multi-bit errors or multi-bit defects that may be present. Via the data words of the addresses stored in the auxiliary memory—which are properly corrected by the error detection—a checksum is then formed and stored, for example using a CRC method. A secured storing can also make sense here, for example using a double storage. In addition, it is also possible to additionally store the addresses of the auxiliary memory. Subsequently, a cyclical or regularly executed check is carried out in such a way that via the addresses present in the auxiliary memory (or via the previously additionally stored addresses), a checksum is formed and is compared with the checksum formed and stored after the beginning of operation. If the comparison does not yield agreement, a reaction can take place that is appropriate to the severity of the error. The advantage of this procedure is that the checking lasts a comparatively short time, and can therefore also take place during normal operation of the data memory or of the higher-order system. To the extent that further incorrect memory lines or memory line regions have been detected in the meantime during the checks, it can make sense to correspondingly adapt the described cyclical or regularly carried out testing.

Here it can be useful if the write-read test is apportioned to memory line regions, and if different memory line regions are subjected to the write-read test independently, one after the other. In this way, it is possible to carry out the write-read test, and the handling of the addresses and data words based thereon according to the present invention, even during active operation of the data memory. If warranted, for this purpose for a given memory region it is necessary first to create a safety copy of the content and then to carry out the write-read test on this region, and subsequently to copy the safety copy back into the region.

In addition, it is provided that the error detection method, or an electronic circuit that carries out the error detection method, is checked for proper functioning after a switching on of the data memory and/or during operation. In this way, it can be ensured that the error detection method, which is a basis for the method according to the present invention, is itself operating without error.

The present invention also relates to a checking program that is capable of being executed on a computer and that is programmed in such a way that it can carry out the example method according to the present invention. Here, "computer" is to be understood as referring to all types of devices that include at least one program memory and a logical circuit that can access this memory. Thus, for example computers, PCs, control and/or regulating devices, for example of motor vehicles, finite state machines using Boolean logic, microprocessor systems, microcontrollers, intelligent USB storage devices, and the like are included under this term.

In addition, the present invention relates to an auxiliary memory for carrying out the method. This can be realized as an independent unit or can also be integrated into arbitrary existing memory systems or, electronic circuits.

In the following, numerous further example embodiments of the present invention are described in successive short presentations. These can be important for the present invention individually or also in any combination.

For very safety-critical applications, one measure can be to tolerate transient errors but to trigger a reaction already on the basis of an individual permanent one-bit defect, or to transfer the data memory or the higher-order system into a state evaluated as safe.

For applications in which, in contrast, availability is of primary importance, it can be offered to do completely without the use of the checking program and to limit the error handling essentially to error correction.

Transient errors in the data memory can be corrected immediately by the checking program after they have been detected, or alternatively a waiting period can be realized during which the relevant memory location remains under observation.

The checking program can determine a rate of the occurrence of the transient errors and can carry out additional checks and/or measures if the rate exceeds a boundary value.

Before switching off the data memory, the checking program can attempt to rewrite memory locations of a flash memory evaluated as incorrect.

The checking program can divide the data memory among a plurality of data line regions, and for safety-critical data contents can use those data line regions that are free of permanent defects.

The checking program can allocate detected one-bit errors and/or one-bit defects to their respective memory line region, and can subject memory line regions that have such errors and are evaluated as safety-critical to separate checks.

The following possible embodiments of the present invention relate generally to a checking according to the method of the data memory in connection with the write-read test:

The write-read test that checks the data memory can be carried out using a specific write-read test program, or can be carried out alternatively and at least in part by an electronic circuit. If the write-read test is carried out using a program-supported procedure, then, triggered already by the execution of the test, addresses of incorrect memory lines can be written to the auxiliary memory.

In the case of a read-only test of a non-volatile memory, for example a flash memory or ROM/read-only memory, checksums can be formed over the entire data memory or over individual memory line regions. In addition, the error detection can be activated, and it can be checked which of the errors are capable of being corrected by the error detection system.

Moreover, using the method according to the present invention the addresses of memory lines affected by errors can be written to the auxiliary memory and made available to the checking program. Alternatively, even when the error detection is deactivated the non-volatile data memory can be read and the result can be used for a comparison.

In addition, it is possible to carry out the write-read test, or the read-only test, in such a way that each memory location of a memory line is accessed once with and once without the action of the error detection, and that subsequently the two results are compared. In order to detect possible errors in the redundant bits, in addition a recalculation of the data words and of the associated redundant bits can be carried out, and subsequently the recalculated redundant bits can be compared with the redundant bits formerly stored in the memory line.

It can be a goal of the write-read tasks to fill the auxiliary memory with the addresses of all memory lines evaluated as incorrect. Subsequently, for detected and/or corrected errors that occur in memory lines whose addresses are up to now not present in the auxiliary memory, a novel error can be inferred and suitable measures can be carried out. This can if warranted be introduced by a so-called interrupt of the higher-order system, the interrupt for example being produced at the time at which, in normal operation of the data memory, an occupancy bit of the auxiliary memory is set.

The following possible embodiments of the present invention relate generally to a checking according to the method of the data memory in connection with a checking of the proper functioning of the error detection:

As soon as a checking of the proper functioning of the error detection has been carried out, for example after the switching on of the data memory or of the higher-order system, a logic system, i.e., an electronic circuit, that checks the error detection can advantageously also be checked during a general self-test of the data memory or of the higher-order system. In this way, the checking of the error detection can be made still more reliable. As soon as a particular specific embodiment is technically enabled, the error detection, and/or the logic that checks the error detection, can be checked not only at the beginning of operation but also during normal operation of the data memory in a comparable manner. Alternatively to the checking logic, the checking of the error detection can also take place using a special program part. Optionally, the checking in normal operation can also be carried out only when the auxiliary memory is not empty.

In addition, the error detection can be checked by reading one or more intentionally incorrectly written data words, or data words detected as incorrect, from the data memory, and checking and/or evaluating the correction properties of the error detection for these data words.

For memories that cannot be written to during operation, incorrect data words can be intentionally written to specified addresses, including both one-bit errors and multi-bit errors. The proper functioning of the error detection can therefore be tested by accessing these addresses. Here it can be useful to remove these addresses from the read-only test of the data memory in order to avoid overflow of the auxiliary memory. After the checking is concluded, the specified addresses in the auxiliary memory can be erased, and the associated occupancy bit can be reset.

In the case of a RAM memory or other realizations of data memories that can be written to during operation, the intentionally incorrect data words can also be produced during operation by a program part, by separately producing and writing the data words and the associated redundant bits while the error detection is temporarily deactivated. Subsequently, the checking of the error detection is carried out. Here it can make sense to limit this checking to those memory lines that up to now have not been evaluated as incorrect. It can likewise make sense, after termination of the checking, to erase or reset the predetermined addresses and the associated occupancy bit.

Furthermore, it is possible to carry out the checking of the error detection only when the data memory already has detected errors or permanent defects, and here to use only the memory lines evaluated as incorrect.

In addition, it is possible to regularly carry out the checking of the error detection, a different memory line region being used each time, in such a way that with repeated checks the entire data memory can generally be included in the check.

The following possible embodiments of the present invention relate generally to a checking according to the method of the data memory in connection with a write-read test or a read-only test:

In addition, it is possible to carry out a write-read test in such a way that an original memory line region is selected—for example in physical or logical proximity to a particular memory line—which, in a first step, is saved by copying into another free memory line region. Subsequently, in a second step the original memory line region is checked using the write-read test. For non-writable specific embodiments of the data memory, such as flash memories or ROM memories, checksums can be formed over the memory line regions. Finally, the saved data can be rewritten into the original memory line region if warranted.

The carrying out of such a write-read test, or read-only test, together with the method according to the present invention for monitoring the data memory, makes it possible to check the entire data memory within a particular time span, so that also the addresses of all incorrect memory lines are present in the auxiliary memory within this time span.

The following possible embodiments of the present invention relate generally to a checking according to the method of the data memory in connection with a so-called memory masking:

For this purpose, it is provided that the addresses of the data memory stored in the auxiliary memory via the method are no longer to be used, or are to be used only in exceptional cases. For this, three possibilities are proposed:

(A) Use of a so-called memory management unit (MMU) that functionally corresponds to the above-described memory management or belongs thereto. Here, those addresses that were evaluated as incorrect and stored in the auxiliary memory in a write-read test or read-only test start-up that took place at the beginning of operation are shared with the memory management, or MMU. In this way, these (physical) addresses can easily be blocked for further use.

(B) Separation in terms of circuitry of the affected regions: individual memory lines and/or memory line regions of a data memory are purposely masked out using separating points, (integrated) fuses, or switches. The example method according to the present invention can usefully be combined with such a masking out, similar to the manner described above in (A). The addresses stored in the auxiliary memory can thus be used for the masking out. This can for example take place during operation, during a specialized operating time, or manually in a workshop.

(C) Program-related measures, so-called "learning software": in the allocation of memory lines or memory line regions ("memory allocation"), addresses that are stored in the auxiliary memory are no longer used.

The following possible embodiment of the present invention relates generally to a checking according to the method of the data memory in connection with an error memory:

Before the switching off of the data memory or of the higher-order system, which can for example be situated in a motor vehicle, an entry can be made in an error memory concerning the content of the auxiliary memory. In this way, the addresses or memory lines detected as incorrect can be logged.

In this way, inter alia, important items of information can be saved for a workshop diagnosis.

An object of the present invention is also achieved by a checking program and a storage medium. Further features of the present invention are indicated in the description below of exemplary specific embodiments and in the figures, such that the features can be important for the present invention both alone and in various combinations, without explicit reference thereto being made again.

DETAILED DESCRIPTION OF EXAMPLE EMBODIMENTS

Figure 1:
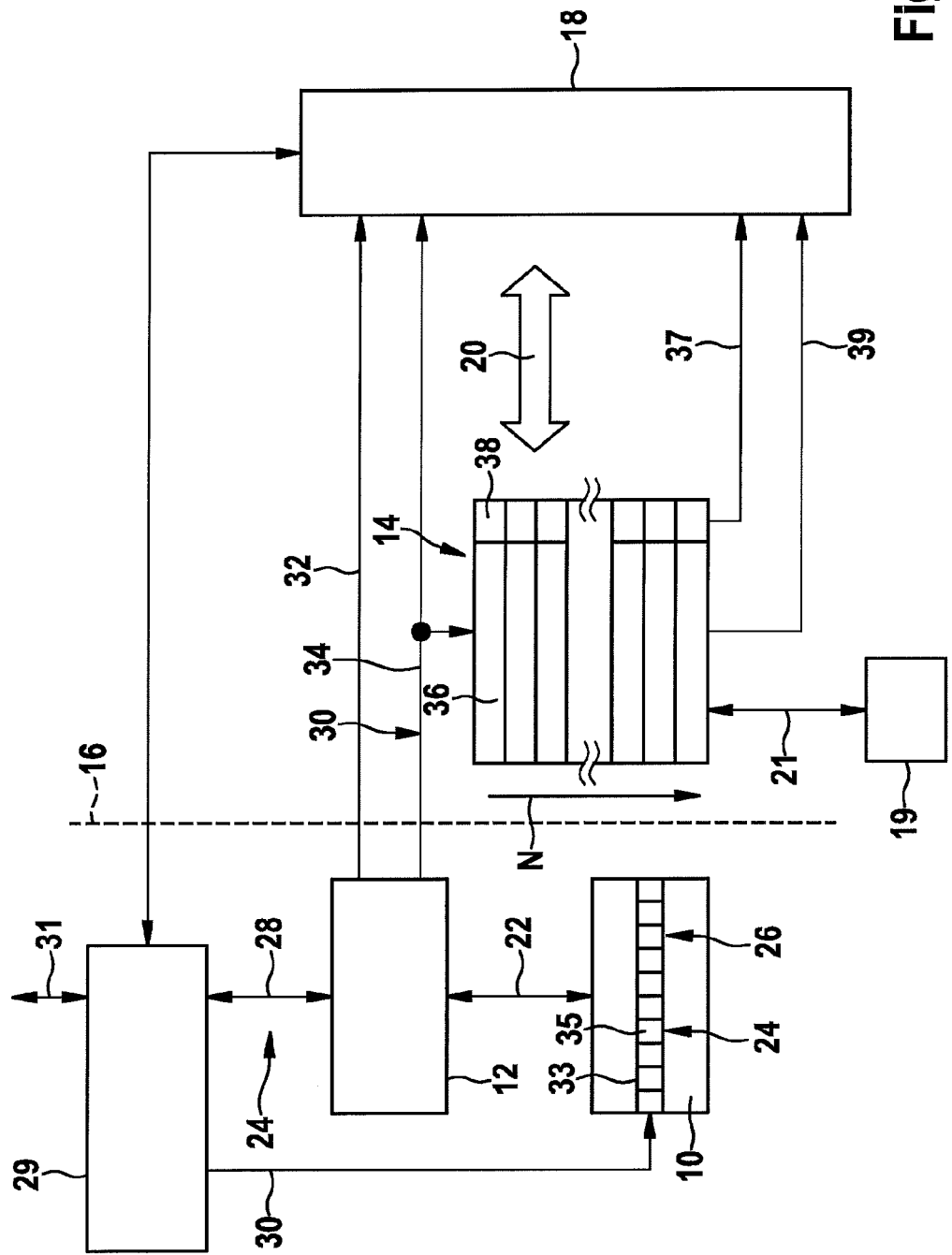
FIG. 1 shows a schematic diagram of a data memory having a circuit for error detection and an auxiliary memory.

FIG. 1 shows a data memory 10 having an error detection 12 and an auxiliary memory 14 connected to error detection 12. In the figure shown in FIG. 1, a perpendicular dashed line 16 separates the conventional part (at the left) from the example additional electronic circuit according to the present invention (at the right). Likewise, in the right part of the figure a checking program 18 is shown that, inter alia, is capable of making read and write accesses to auxiliary memory 14 and processing the information therein. This is indicated symbolically by a double arrow 20. As needed, checking program 18 can also access other information present in the environment of data memory 10 and error detection 12. A non-volatile memory 19 is connected to auxiliary memory 14 via a bidirectional data connection 21.

Overall, the schema of FIG. 1 shows both circuit-based elements (hardware) and also computer-supported procedures (software). Error detection 12 (ECC, or Error Correction Coding) is realized in the present case as an electronic circuit. In addition, the elements shown in FIG. 1 can be divided among a plurality of electronic components, or can be accommodated together on only one element (one-chip solution).

Data memory 10 is connected bidirectionally to error detection system 12. An inner data path 22 guides data words 24 that are to be stored, or are stored, in data memory 10, and which have been supplemented in error detection 12 with associated redundant bits 26. Each of data words 24 includes a plurality of bits in an arbitrary, but fixed, number. An outer data path 28 supplies data words 24 without redundant bits 26 to a memory management 29, bidirectionally. Likewise, addresses 30 are supplied to data memory 10 for the management of the data stored therein by memory management 29. Here, each address 30 points to an associated memory line 33 of data memory 10, i.e., memory line 33 includes memory locations 35 for each bit in a number that corresponds at least to the length of data word 24 plus the respective associated redundant bits 26.

Memory management 29 can also exchange information with checking program 18, and can be realized as an electronic circuit and/or as a computer-supported procedure. However, this is not explained in more detail at present. A bidirectional arrow 31 shows a connection to a higher-order system. The higher-order system is, for example, a control and/or regulating device of a motor vehicle, a computer (PC), a microcontroller, a data mass memory, or the like. However, this is not shown in FIG. 1.

A first output 32 of error detection 12 outputs information when multi-bit errors are detected and/or corrected. A second output 34 outputs information when one-bit errors are detected and/or corrected, and supplies these, inter alfa, to auxiliary memory 14 in the form of address 30. An overflow signal 37 is produced when the total number N of address registers 36 are filled with valid addresses 30, and thus all associated occupancy bits 38 are also set. A flag 39 indicates that a new address 30 was currently written to auxiliary memory 14. Flag 39 can for example be used to trigger a temporary program interruption, designated an interrupt.

Auxiliary memory 14 contains a number N of address registers 36 that are stored together with a respective associated occupancy bit 38. Uppermost address register 36 in the drawing, and uppermost occupancy bit 38 in the figure, are identified by their reference characters. Here, the number N indicates the highest number of entries capable of being stored in auxiliary memory 14.

If error detection 12 detects and corrects a one-bit error, the address 30 of the affected data word 24 is compared with all valid addresses 30 stored in auxiliary memory 14. An address 30 in auxiliary memory 14 is "valid" when the associated occupancy bit 38 is set, i.e., for example has the binary value 1. If this address 30 is already stored in auxiliary memory 14, no further reaction takes place. If, in contrast, address 30 is not yet stored in auxiliary memory 14, it is stored in auxiliary memory 14 in an empty address register 36. An empty (i.e., not "valid") address register 36 is recognizable in that the associated occupancy bit 38 is not set, i.e., for example has the binary value 0. After the storing of address 30 in address register 36, its associated occupancy bit 38 is set.

Within specifiable time intervals, or at specified times, checking program 18 is regularly executed. This process is triggered in the present case by memory management 29. For each valid address 30 stored in auxiliary memory 14, checking program 18 investigates whether data word 24 designated by the respective address 30 actually has only a single incorrect bit. If, however, a multi-bit error or multi-bit defect is discovered in a data word 24 and/or a number of one-bit errors or one-bit defects are discovered in a plurality of data words 24 by checking program 18, in each case specifiable reactions can take place. These reactions can include:

deactivation of a defective memory line 13 and/or assignment of a substitute memory line 33;

deactivation of a defective memory line region and/or assignment of a substitute memory line region;

production of a message, an alarm, and/or an error bit;

transferring data memory 10 and/or the system at a higher level than data memory 10 into a state evaluated as safe.

Independent of the functioning of checking program 18, alternatively or in addition overflow signal 37 of auxiliary memory 14 can be used to transfer data memory 10 and/or the higher-order system into a state evaluated as safe, because it is to be assumed that data memory 10 overall is no longer operating with adequate reliability, and is therefore unusable.

The distinction between one-bit errors and multi-bit errors can be made in the case of volatile memories (RAM) by using a write-read test adapted to particular error patterns that are to be expected, the test being carried out for example at the beginning of operation or during normal operation of data memory 10. In non-volatile memories (flash), this can take place using a CRC checksum method (Cyclic Redundancy Check).

If data memory 10 is realized as a volatile memory, checking program 18 additionally investigates whether an error, or an error pattern, is permanently present in a respective memory line 33 of data memory 10 (defect), or whether the error, or error pattern, occurred only transiently. In the latter case, the associated address register 36 is emptied by resetting its occupancy bit 38. In addition, checking program 18 can check whether properly corrected one-bit errors or one-bit defects, or incorrectly detected or wrongly corrected multi-bit errors or multi-bit defects, are present. Moreover, checking program 18 can if warranted correct detected errors of data word 24, and can also carry out an error count or apply a statistical evaluation of errors.

In addition, it is possible to make the triggering of the reaction(s) a function of specifiable conditions and specifiable boundary values. For example, a minimum number of possible one-bit defects can be specified at which threshold a reaction corresponding to the significance of the error is triggered.

Non-volatile memory 19 is connected to auxiliary memory 14 via a bidirectional data connection 21, and has the task of securing the content of auxiliary memory 14 before a switching off of data memory 10 or of the higher-order system, and of reconstructing this content again in auxiliary memory 14 after a switching on.

Figure 2:
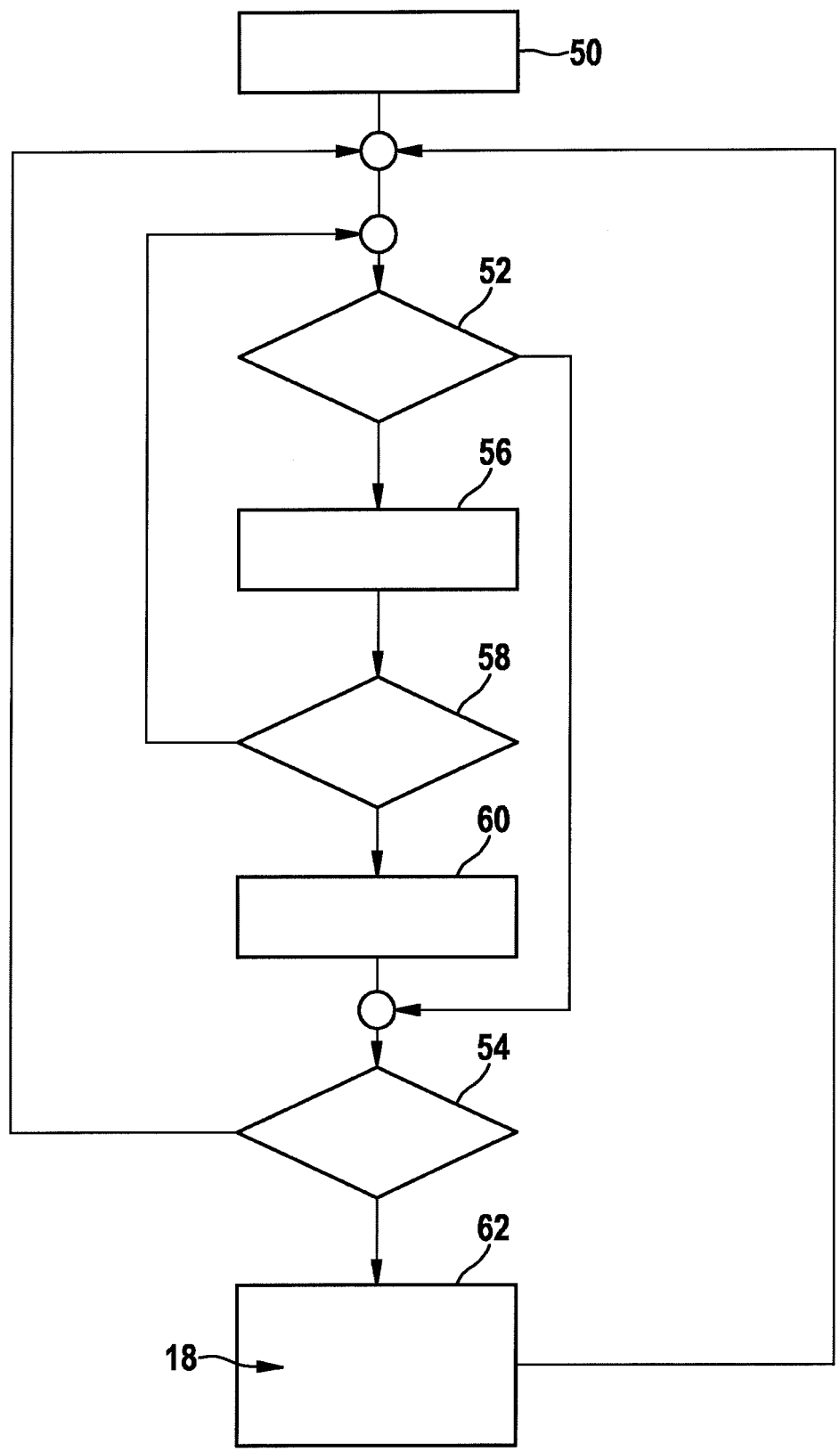
FIG. 2 shows a flow diagram having method steps of the method according to the present invention, according to an exemplary embodiment.

In a flow diagram, FIG. 2 shows method steps, executable for example by a computer program, of a possible specific embodiment of the method according to the present invention. Alternatively or in addition to execution by a computer or by a control device, logical circuits can be involved.

The procedure begins in a start block 50. In a query block 52, it is checked whether a one-bit error is currently detected and/or was corrected by error detection 12. If this is not the case, branching takes place to a query block 54.

If a one-bit error is currently detected and/or was corrected by error detection 12, then in a block 56 the address 30 of data memory 10 belonging to the one-bit error is acquired. In a query block 58, it is checked whether this address 30 is already present in auxiliary memory 14. If this is the case, then in the exemplary embodiment forming the basis of FIG. 2 no further reaction takes place, and branching takes place back to query block 52.

If address 30 is however not yet present in auxiliary memory 14, branching takes place to a block 60. There, this address 30 is written to an empty address register 36 of auxiliary memory 14, and the associated occupancy bit 38 is set. As needed, other addresses 30 present in auxiliary memory 14 can here be shifted and/or sorted. The method is then continued in query block 54.

In query block 54, it is checked whether conditions are present for starting checking program 18. If this is not the case, branching takes place back to block 52. If it is the case, then in a block 62 checking program 18 is started. Subsequently, branching takes place back to query block 52 and the procedure is continued.

Of course, the procedure shown in FIG. 2 is intended only as an example. Further specific embodiments are possible. In addition, it can be provided that the procedure is started, halted, or aborted by the higher-order system. However, this is not shown in further detail in FIG. 2.

What is claimed is:

1. A method for monitoring a data memory, comprising:
    applying, by processing circuitry, an error detection method to the data memory to at least one of detect and correct incorrect data words stored in memory lines of the data memory;
    for each of at least a subset of data words evaluated as incorrect by the error detection method, writing, by the processing circuitry and to an auxiliary memory, an address of the data memory at which the respective data word is stored; and
    applying, by the processing circuitry, a checking program that, when at least one of the data memory addresses is stored in the auxiliary memory, cyclically runs through the auxiliary memory on a schedule that is independent of the application of the error detection method, to perform an error detection for the data memory addresses stored in the auxiliary memory.

2. The method as recited in claim 1, wherein the processing circuitry includes an electronic circuit allocated to the data memory for carrying out the error detection method.

3. The method as recited in claim 1, wherein only those addresses are written to the auxiliary memory whose data words were evaluated by the error detection method as being correctable.

4. The method as recited in claim 1, wherein for each address stored in the auxiliary memory it is indicated whether the address is valid.

5. The method as recited in claim 1, wherein when the error detection method detects an incorrect data word, addresses already written to the auxiliary memory are examined in order to determine whether the address of the incorrect data word is already stored.

6. The method as recited in claim 1, wherein for each of the data words whose respective address is stored in the auxiliary memory, the checking program determines at least one of: i) whether the data word has a one-bit error or a multi-bit error, ii) whether a memory line of the data word has a defect that corresponds to a one-bit error or to a multi-bit error, iii) whether an error of the memory line of the data word occurs temporarily or permanently, and iv) which memory locations within the memory line are affected in each case.

7. The method as recited in claim 1, wherein in the case of a volatile Random Access Memory (RAM), the checking program carries out a write-read test matched to error mechanisms that are to be expected.

8. The method as recited in claim 1, wherein in the case of a non-volatile memory, the checking program carries out an error test using a checksum of a CRC coding.

9. The method as recited in claim 1, wherein a distinction is made between i) properly correctable errors, ii) wrongly corrected or wrongly detected multi-bit errors, and iii) transient errors or permanent defects.

10. The method as recited in claim 1, wherein threshold values are specified for a permissible number of at least one of one-bit errors, multi-bit errors, one-bit defects and multi-bit defects, and if at least one threshold value is exceeded a reaction of the memory management takes place.

11. The method as recited in claim 1, wherein the reaction of the memory management includes at least one of the following measures:
    at least one of deactivating a defective memory line and allocating a substitute memory line;
    at least one of deactivating of a defective memory line region and allocating a substitute memory line region;
    producing of at least one of a message, an alarm, and an error bit; and transferring at least one of the data memory and a system at a higher level than the data memory, into a state evaluated as safe.

12. The method as recited in claim 11, wherein before a switching off of the data memory or of a system at a higher level than the data memory, content of the auxiliary memory is saved to a non-volatile memory, and is reconstructed therefrom after a switching on.

13. The method as recited in claim 1, wherein data word errors detected by the checking program are corrected.

14. The method as recited in claim 1, wherein at least one of transient errors and permanent defects are at least one of counted and statistically evaluated.

15. The method as recited in claim 14, wherein a result of one of the counting and the statistical evaluation is communicated to a manufacturer of the data memory or of a higher-order system.

16. The method as recited in claim 1, wherein at least one of after a switching on, and during an operation of the data memory, a functional test of the data memory is carried out, and addresses of the data memory that point to memory lines that were evaluated as incorrect during the functional test are written to the auxiliary memory.

17. The method as recited in claim 1, wherein one of the error detection method or an electronic circuit that executes the error detection method, is checked for proper functioning at least one of after a switching on of the data memory, and during operation.

18. The method as recited in claim 1, wherein addresses of only those data words identified by the error detection method as including only a 1-bit error are written to the auxiliary memory.

19. The method as recited in claim 1, wherein an address of a data word that the error detection method identifies as including a correctable error, and which the error detection method corrects, is written to the auxiliary memory for application thereto of the checking program.

20. The method as recited in claim 1, wherein at least one algorithm applied by the checking program for error detection of data words at addresses stored in the auxiliary memory are not applied by the error detection method.

21. The method as recited in claim 1, further comprising:
responsive to the auxiliary memory reaching maximum fill capacity by writing thereto of the data memory addresses, transferring the data memory into a safe mode.

22. The method as recited in claim 1, wherein the processing circuitry includes a first circuit that executes the error detection method and a second circuit that executes the checking program.

23. The method as recited in claim 1, wherein a location in the data memory identified by one of the addresses written to the auxiliary memory initially remains usable until the checking program determines that the location is permanently damaged, in response to which the checking program sets the location of the data memory as unusable.

24. A method for monitoring a data memory, comprising:
using an error detection method to at least one of detect and correct incorrect data words stored in memory lines of the data memory;
writing to an auxiliary memory an address of the data memory at which a data word evaluated as incorrect by the error detection method is stored; and
making the address available to a checking program;

wherein:
at least one of after a switching on and during an operation of the data memory, a functional test of the data memory is carried out, and addresses of the data memory that point to memory lines that were evaluated as incorrect during the functional test are written to the auxiliary memory; and
a first checksum is formed over memory lines whose addresses are stored in the auxiliary memory, and the first checksum is stored, the addresses used for the formation of the first checksum being additionally saved, and during further operation of the data memory, at least one further checksum is formed over memory lines one of whose addresses were stored in the auxiliary memory or whose addresses were additionally saved, and the at least one further checksum is compared with the first checksum.

25. The method as recited in claim 16, wherein the functional test is divided among memory line regions, and different memory line regions are subjected to the functional test independently in succession.

26. A non-transitory computer readable storage medium on which are stored instructions that are executable by processing circuitry and that, when executed by the processing circuitry, cause the processing circuitry to perform a method for monitoring a data memory, the method comprising:
applying an error detection method to the data memory to at least one of detect and correct incorrect data words stored in memory lines of the data memory;
for each of at least a subset of data words evaluated as incorrect by the error detection method, writing to an auxiliary memory an address of the data memory at which the respective data word is stored; and
applying a checking program that, when at least one of the data memory addresses is stored in the auxiliary memory, cyclically runs through the auxiliary memory on a schedule that is independent of the application of the error detection method, to perform an error detection for the data memory addresses stored in the auxiliary memory.

27. An auxiliary memory in a computer, the auxiliary memory comprising:
registers; and
an interface to processing circuitry that is configured to:
apply an error detection method to a data memory to at least one of detect and correct incorrect data words stored in memory lines of the data memory;
for each of at least a subset of data words evaluated as incorrect by the error detection method, write to a respective one of the registers of the auxiliary memory an address of the data memory at which the respective data word is stored; and
apply a checking program that, when at least one of the data memory addresses is stored in the auxiliary memory, cyclically runs through the registers of the auxiliary memory on a schedule that is independent of the application of the error detection method, to perform an error detection for the data memory addresses stored in the auxiliary memory.

* * * * *